(12) United States Patent
Howlett et al.

(10) Patent No.: US 11,528,031 B2
(45) Date of Patent: Dec. 13, 2022

(54) ADC CIRCUITRY

(71) Applicant: Cirrus Logic International Semiconductor Ltd., Edinburgh (GB)

(72) Inventors: Andrew J. Howlett, Edinburgh (GB); David P. Singleton, Edinburgh (GB); Aniruddha Satoskar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 75 days.

(21) Appl. No.: 17/184,295

(22) Filed: Feb. 24, 2021

(65) Prior Publication Data

US 2021/0273646 A1 Sep. 2, 2021

Related U.S. Application Data

(60) Provisional application No. 62/982,783, filed on Feb. 28, 2020.

(51) Int. Cl.
| | | |
|---|---|---|
| H03M 1/00 | (2006.01) | |
| H03M 1/12 | (2006.01) | |
| H03F 3/217 | (2006.01) | |
| H03G 3/00 | (2006.01) | |
| H03G 9/00 | (2006.01) | |
| H03M 1/08 | (2006.01) | |

(52) U.S. Cl.
CPC ............ *H03M 1/12* (2013.01); *H03F 3/2175* (2013.01); *H03G 3/001* (2013.01); *H03G 9/005* (2013.01); *H03M 1/08* (2013.01); *H03F 2200/03* (2013.01)

(58) Field of Classification Search
CPC .... H03M 1/1215; H03M 1/188; H03M 1/002; H03M 1/0682; H03M 1/0697; H03M 1/1225; H03M 3/466; H03M 1/00; H03M 1/004; H03M 1/005; H03M 1/0631; H03M 1/0636; H03M 1/12; H03M 1/1205; H03M 1/123; H03M 1/124; G01S 7/34
USPC ........ 341/140, 141, 155, 159, 161, 118, 120
See application file for complete search history.

(56) References Cited

U.S. PATENT DOCUMENTS

| | | | | |
|---|---|---|---|---|
| 6,032,033 | A | * | 2/2000 | Morris ................. H04B 7/0811 370/347 |
| 6,191,725 | B1 | * | 2/2001 | Lavoie ..................... G01S 7/34 342/195 |

(Continued)

OTHER PUBLICATIONS

Combined Search and Examination Report under Sections 17 and 18(3), UKIPO, Application No. GB2003927.7, dated Aug. 26, 2020.

*Primary Examiner* — Linh V Nguyen
(74) *Attorney, Agent, or Firm* — Jackson Walker L.L.P.

(57) ABSTRACT

This application relates to ADC circuitry. An ADC circuit (200) has first and second conversion paths (201a, 201b) for converting analogue signals to digital and is operable in first and second modes. In the first mode, the first and second conversion paths are connected to respective first and second input nodes (202a, 202b) to receive and convert full scale first and second analogue input signals (Ain1, Ain2) to separate digital outputs (Dout1, Dout2). In the second mode, the first and second conversion paths are both connected to the first input node (202a), to convert the first analogue input signal (Ain1) to respective first and second digital signals, and the first and second conversion paths are configured for processing different signal levels of the first analogue input signal. A selector (207) select the first digital signal or the second digital to be output as an output signal based on an indication of amplitude of the first analogue input signal.

23 Claims, 3 Drawing Sheets

(56) References Cited

U.S. PATENT DOCUMENTS

| | | | | |
|---|---|---|---|---|
| 7,620,127 | B1 * | 11/2009 | Koenck | H04L 27/0008 |
| | | | | 375/340 |
| 7,916,050 | B1 * | 3/2011 | Mujica | H03M 1/004 |
| | | | | 455/108 |
| 9,071,267 | B1 * | 6/2015 | Schneider | H03M 1/002 |
| 9,509,332 | B1 * | 11/2016 | Garrity | H03M 3/468 |
| 9,584,145 | B1 * | 2/2017 | Shin | H03M 1/1028 |
| 9,608,653 | B2 * | 3/2017 | Le Dortz | H03M 1/1215 |
| 11,363,227 | B1 * | 6/2022 | Young | H04N 5/37455 |
| 2012/0001786 | A1 | 1/2012 | Hisch | |
| 2012/0074972 | A1 * | 3/2012 | Rasbornig | B60T 8/885 |
| | | | | 324/750.3 |
| 2018/0247522 | A1 * | 8/2018 | Motz | G08C 15/02 |
| 2021/0367607 | A1 * | 11/2021 | Molina | H03M 1/1042 |

* cited by examiner

ADC CIRCUITRY

FIELD OF DISCLOSURE

The field of representative embodiments of this disclosure relates to methods, apparatus and/or implementations concerning or relating to ADC (analogue-to-digital converter) circuitry.

BACKGROUND

There are a number of applications where analogue to digital conversion is implemented, for example for converting analogue audio signals generated by an input transducer, such as a microphone, to digital signals for processing, transmission and/or storage. Typically, an ADC circuit with an analogue-front-end (AFE) is used to receive the analogue input signals and convert to digital. Preferably, the ADC circuit should be able to convert received input signals at the maximum expected signal amplitude in normal operation without distortion or clipping, which may require the ADC circuit to have a relatively high dynamic range. In at least some applications it may also be desirable for the ADC circuit to also be able to convert relatively low amplitude input signals with a relatively good SNR (signal-to-noise ratio), which requires the ADC circuit to be able to operate with relatively low noise.

One way to implement an ADC circuit that provides good performance with a high dynamic range is to provide the ADC circuit with multiple conversion paths, where each conversion path is coupled to the ADC input and is optimised for a particular input signal range. For example a dual-path ADC circuit may comprise one conversion path which is optimised for lower amplitude input signals to provide good SNR for low signal levels, and another conversion path which is optimised for converting higher amplitude signals without significant distortion, so that the ADC circuit can provide a relatively high dynamic range. Depending on the level of the input signal, the appropriate path can be used to provide the digital output.

SUMMARY

Embodiments of the present disclosure relate to ADC circuitry that is capable of multi-path operation.

According to an aspect of the disclosure there is provided analogue to digital conversion circuitry comprising a first input node for receiving a first analogue input signal, a second input node for receiving a second analogue input signal, a first conversion path for converting analogue signals to digital, and a second conversion path for converting analogue signals to digital. The analogue to digital conversion circuitry is selectively operable in a first mode or a second mode. In the first mode, the first conversion path is connected to the first input node to convert the first analogue input signal to a first digital signal and the second conversion path is connected to the second input node to convert the second analogue input signal to a second digital signal. In the first mode each of the first and second conversion paths are configured for processing a full scale of the respective first and second analogue input signals and the first and second digital signals are output as first and second output signals respectively. In the second mode, the first conversion path and the second conversion path are both connected to the first input node to convert the first analogue input signal to respective first and second digital signals. In the second mode, the first and second conversion paths are configured for processing different signal levels of the first analogue input signal and a selector is configured to select the first digital signal or the second digital to be output as an output signal based on an indication of amplitude of the first analogue input signal.

In some examples, the second mode, the first conversion path may be configured for processing a full scale of the first analogue input signal and the second conversion path may be configured for processing lower amplitude signal levels of the first analogue input signal.

The first and second conversion paths may each comprise respective analogue-front-ends. In the second mode of operation, the respective analogue-front-end of the second conversion path may be configured to apply a larger gain to the first analogue input signal that the analogue-front-end of the first conversion path. In some implementations, the analogue-front-end of the second conversion path may comprise a programmable gain amplifier. A mode controller may control the gain of the programmable gain amplifier of the analogue-front-end of the second conversion path to be different in the first and second modes. The analogue-front-end of the first conversion path may additionally or alternatively comprise a programmable gain amplifier.

At least one of the first and second conversion paths may comprise a digital gain element for applying a gain to the relevant first digital signal or second digital signal in the second mode to provide gain matching of the first and second conversion paths.

In some embodiments, the analogue to digital circuitry may be operable to dynamically switch between the first and second modes in use.

The circuitry may comprise at least one switch for selectively connecting the second conversion path to the first input node or the second input node. The second conversion path may be configured to be switchably connected to the first input node via a first input resistor and switchably connected to the second input node via a second, different input resistor.

In some examples, the selector may comprise a fader configured to transition between outputting one of the first and second digital signals as the selector output signal to outputting the other of the first and second digital signals by cross-fading between the first and second digital signals.

In some example a controller may be configured to, when operating in the second mode, suspend or disable at least some components of the first conversion path in response to a low-signal condition. The low-signal condition may comprise the amplitude of the second digital signal remaining below a defined threshold for a defined period of time.

In some examples there may be at least one additional conversion path operable, in one mode, to be connected to an associated additional input node to convert an additional analogue input signal received at that additional input node to a digital signal. The at least one additional conversion path may be further operable, in another mode, to be connected to one of the first input node, the second input node or a further additional input node, to convert the analogue input signal received at the relevant input node to a digital signal.

In some examples a clipping controller may be configured to, when operating in the second mode, to control the second conversion path to reduce or prevent a non-linear current being drawn from the first input node due to clipping of the second conversion path. The clipping controller may be configured to control a gain of the second conversion path to prevent clipping of the second conversion path and/or the clipping controller may be configured to reconfigure the second conversion path to provide regulation of a virtual earth node of the second conversion path.

In some examples the circuit may be configured to output an indication of instantaneous noise and/or dynamic range. The analogue to digital conversion circuitry may comprise a module for determining the indication of instantaneous noise and/or dynamic range based on a setting of the selector that determines contribution to the output signal from the first digital signal and the second digital signal.

The analogue to digital conversion may be implemented as an integrated circuit. In some cases, a first microphone may be coupled to the first input node of the integrated circuit and a second microphone may be coupled to the second input node of the integrated circuit.

Aspects also relate to an electronic device comprising analogue to digital conversion circuitry according to any of the embodiments discussed herein.

In another aspect there is provided an analogue to digital conversion circuit comprising: a first analogue-to-digital conversion path, and a second analogue-to-digital conversion path. The analogue to digital conversion circuit is operable in: a first mode in which the first and second analogue-to-digital conversion path are connected to different input nodes to one another to process separate input signals from separate sources; and a second mode in which the first and second analogue-to-digital conversion path are connected to the same input node as one another to process different signal levels of the same input signal.

In another aspect there is provided an ADC circuit comprising: a first ADC path, and a second ADC path, wherein the ADC circuit is operable is operable to connect the first and second ADC paths to different inputs to process separate analogue input signals from separate sources and is also operable to connect the first and second ADC paths to the same input to process the same input signal with different analogue gains applied.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As noted above ADC circuits with multiple parallel conversion paths optimised for different signal levels of an input analogue signal have been proposed previously.

Figure 1:
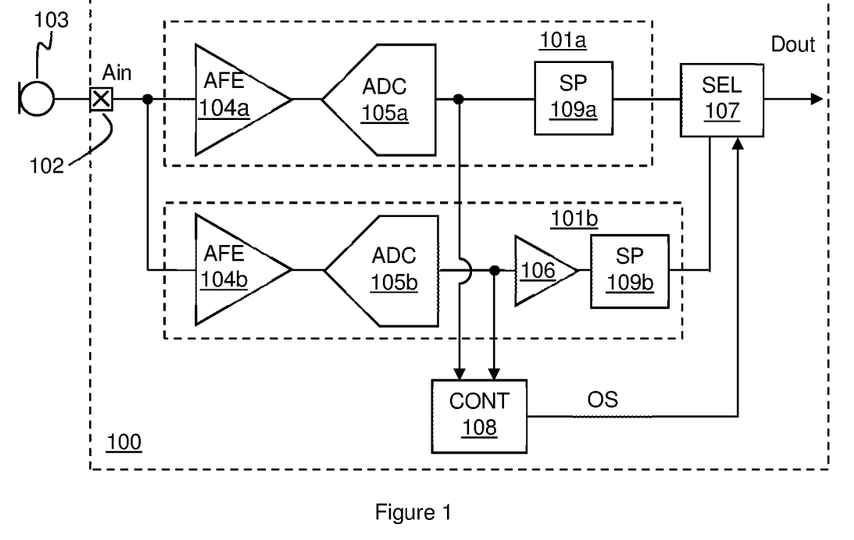
FIG. 1 illustrates a conventional dual-path ADC circuit.

FIG. 1 illustrates one example of a conventional ADC circuit 100 with two conversion paths 101a and 101b optimised for different signal levels. The ADC circuit 100 has an input node 102 for receiving an analogue input signal Ain from a source 103 such as a transducer, which in this example is a microphone. In such an example the ADC circuit 100 may be formed as an integrated circuit and configured, in a host device, to receive an input signal from a microphone 103 which is external to the integrated circuit, i.e. from an off-chip microphone. The microphone could be a microphone of the host device or a microphone of a removable accessory apparatus which may, in use, be removably connected to the host device via some wired connection. The input node 102 may thus comprises an input terminal of the ADC circuit (or a node of a signal path connected to such an input terminal). Both conversion paths 101a and 101b are coupled to the input node 102 so as to be able to receive and convert the analogue input signal Ain to a digital signal.

Each of the conversion paths 101a and 101b comprises a respective AFE 104a and 104b and ADC 105a and 105b. The AFE of each conversion path comprises circuitry for conditioning the input analogue signal Ain for conversion by the respective ADC and may typically comprise an amplifier. As noted above, the conversion paths 101a and 101b are optimised for different input signals levels. For example, the first conversion path 101a may be optimised for higher amplitude signals and the second conversion path 101b may be optimised for lower amplitude signals. The AFE 104b and ADC 105b of the second path 101b may therefore be configured with a higher conversion gain than the AFE 104a and ADC 105a of the first path 101a.

The AFE 104a of the first conversion path 101a may be configured with a gain such that, for an input signal with the maximum signal amplitude expected in normal operation, the output of the AFE 104a is within the input range of the ADC 105a and preferably uses substantially all of the input range of the ADC 105a. Such high amplitude input signals will be well above the noise floor of the ADC 105b and can be converted to digital with good SNR.

The first conversion path 101a may thus be configured to convert any received input signal within the normal operating range without significant distortion due to clipping or overload the like. However, for low amplitude input signals, the lower input signal level will be closer to the noise floor of the ADC, which will result in a lower SNR. The AFE 104b of the second conversion path 101b thus comprises an amplifier with a relatively high gain so that a low amplitude input signal is amplified to use a greater extent of the input range of ADC 105b. The second conversion path in this example also includes a digital gain element 106 for applying a digital gain to the output of ADC 105b so as to match the overall conversion gain of the first conversion path 101b. The digital gain element 106 may thus apply a gain to the digital signal in conversion path 101b to compensate for the increased gain of AFE 104b compared to AFE 104a. This may, for example, be an attenuation which has the effect of attenuating the noise of ADC 105b. It will be understood that FIG. 1 illustrates a digital gain element 106 in the second conversion path 101a only, but in some implementations there could additionally or alternative be a digital gain element in the first conversion path 101a for providing gain matching of the two paths.

The second conversion path 101b thus provides a better SNR for lower amplitude input signals. However, for higher amplitude input signals the relatively high gain of AFE 104b will lead to clipping in the second conversion path 102b, i.e. the AFE 104b may experience clipping (and if it didn't the output of AFE 104b would exceed the input range of ADC 105b). The ADC circuit 100 thus includes a selector 107 for selecting the output of the first conversion path 101a or the second conversion path 101b to be output as the digital output signal Dout. A controller 108 may control the selector 107 to select the output of an appropriate path based on characteristics of the signal being converted, for instance the signal amplitude. The controller 108 may monitor one or both of the conversion paths 101a and 101b and, as illustrated in FIG. 1, may monitor the digital signal in the conversion paths to determine which conversion path(s) should contribute to the digital output signal and generate an appropriate output path selection control signal OP.

In some implementations the selector 107 could comprise a selection switch or multiplexor or similar to select the output of one conversion path or the other. However, an abrupt change from using the output of one conversion path to using the other conversion path, for the digital output Dout, could result in some undesired artefacts in the signal content. In some implementations therefore it may be preferable to transition from outputting from one conversion path to the other by cross fading with a contribution from both conversion paths during the transition and thus the selector 107 may comprise a suitable crossfader or mixer or the like.

In addition, there may be at least some processing or conditioning of the digital signals in one or both of the signals paths by respective signal processing modules 109a and 109b, e.g. to apply filtering to remove offsets and/or to provide phase and/or latency matching between the two conversion paths.

A multi-path ADC circuit as illustrated in FIG. 1 can thus provide a relatively high dynamic range, but also a relatively good SNR for conversion of lower amplitude input signals. However, the circuit does require two separate conversion paths coupled to the input node 102, i.e. paths 101a and 101b, each with a dedicated AFE and ADC optimised for that conversion path, which can add to the circuit area required for the ADC circuitry.

A larger circuit area can increase the cost of the integrated circuit. Further, in some applications, circuit size is important and in general a smaller circuit area may be preferred.

In addition, the separate AFE 104b and ADC 105b in the second conversion path add to the power consumption in use, and, especially for portable devices, power consumption is an important consideration. In some applications, the higher performance provided by the multi-path approach may only be required only for certain use cases, and in other use cases the performance of the first conversion path 101a may be sufficient. In which case the components of the second conversion path 101b, e.g. the AFE 104b and/or ADC 105b, may be disabled when not required so as to save power and the selector 107 may be controlled so as to provide the digital output from the first conversion path 101a only.

In some applications it may be desirable for an integrated circuit to be able to receive and convert multiple analogue input signals from different sources. For instance, some electronic devices may comprise multiple microphones and, in such devices, it may be desirable for an audio processing circuit, such as an audio codec or the like, to be able to receive analogue inputs signals from each of the multiple microphones and convert them to digital. Such a processing circuit would have a separate ADC arrangement for processing the input signal from each input and the ADC arrangement for a given input may be implemented as a multi-path ADC if desired, but providing a multi-path ADC arrangement for each input could significantly increase the circuit area.

Embodiments of the present disclosure relate to ADC circuitry having at least two conversion paths, where the ADC circuitry is operable so that the two conversion paths can be coupled to separate input nodes, so as to convert different analogue input signals independently, and where the ADC circuitry is also operable so that the two conversion paths can alternatively be coupled to the same input node so as to convert the same analogue input signal, with each conversion path being configured for processing different input signal levels, so as to provide the benefits of multi-path operation.

Figure 2:
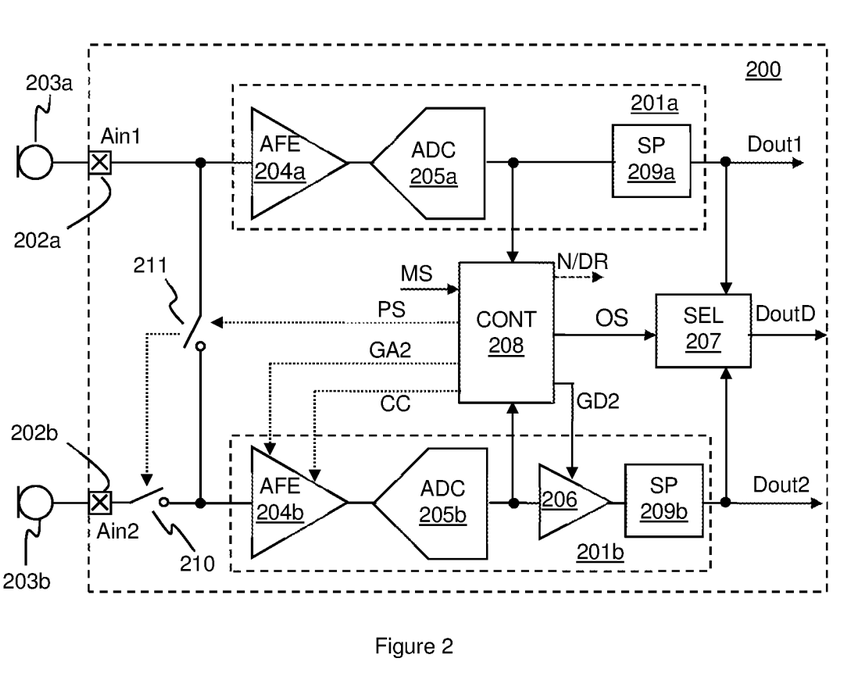
FIG. 2 illustrates an ADC circuit according to an embodiment.

FIG. 2 illustrates generally an example of ADC circuitry 200 according to an embodiment. FIG. 2 illustrates that the ADC circuitry comprises a first conversion path 201a and a second conversion path 201b. The ADC circuitry 200 also comprises a first input node 202a capable of receiving a first analogue input signal Ain1 from a first source and a second input node capable of receiving a second analogue input signal Ain2 from a second, different, source. FIG. 2 illustrates that the first input node may be coupled to receive the first analogue input signal from a first transducer, in this example microphone 203a, and the second input node may be coupled to a second, different, transducer, in this example microphone 203b. The first and second sources, e.g. microphones 203a and 203b may be external to the ADC circuit 200, i.e. off-chip, and the first and second input nodes 202a and 202b may comprise terminals of the ADC circuit 200 for connecting to such external sources (or nodes of a signal path of the ADC circuit 200 coupled to such terminals).

The analogue input signals, Ain1 or Ain2, may be single ended signals or differential input signals, and for differential input signals each input node may be an input node of a differential signal path and thus may comprise two input terminals for the differential signal components. Likewise, the first and second conversion paths 201a and 201b are paths for processing of a signal which may be singled-ended or differential (including pseudo-differential). For differential signals each conversion path may therefore have individual component signals paths for the differential components. It will be noted that the first input node 202a and the second input node 202b are separate inputs for receiving separate signals from different sources, e.g. different microphones. For the avoidance of doubt the first and second input nodes 202a and 202b are thus not part of a differential pair for receiving a differential signal from one source, but are separate inputs for receiving signals that can be independent of one another.

In the ADC circuit 200, the first conversion path 201a is coupled to the first input node 202a to receive the first input signal Ain1, in this example from first microphone 203a. The first conversion path comprises an AFE 204a, an ADC 205a and possibly a digital signal processing module 209a in a similar manner as described with respect to FIG. 1. The AFE 204a of the first conversion path 201a may be configured with a gain such that, for the maximum expected amplitude in normal operation for input signal Ain1, the output of AFE 204a is within the input range of the ADC 205a and preferably uses substantially all of the input range of the ADC 205a. The first conversion path 201a is thus configured for processing a full scale of the first analogue input signal Ain1, i.e. the analogue input signal Ain1 could be received with any amplitude within the normal operating range and converted without significant distortion due to clipping or the like. The first conversion path may thus be seen as a standard performance conversion path able to cope with the full range of the input signal Ain1.

In the example of FIG. 2, the second conversion path 201b may be selectively coupled to either the first input node 202a or to the second input node 202b. The ADC circuit 200 in the example thus comprises switch 210 for selectively connecting or disconnecting the second conversion path 201b to/from the second input node 202b and switch 211 for selectively connecting or disconnecting the second conversion path 201b to/from the first input node 202a. It will be understood however that other switch arrangements or input selection components may be used in other embodiments.

The second conversion path 201b comprises an AFE 204b, an ADC 205, a digital gain element 206 and digital signal processing module 209b, as discussed with reference to FIG. 1, but for the ADC circuit 200 the gain of AFE 204b is variable and the gain of the digital gain element 206 is controllably variable accordingly. In some embodiments the AFE 204b may comprise a programmable gain amplifier (PGA) as will be understood be one skilled in the art. The digital gain element 206 may be any suitable variable digital gain element such as a multiplier.

The ADC circuit 200 is operable in at least two modes of operation.

In a first mode of operation the second conversion path 201b may be connected to the second input node 202b and disconnected from the first input node 202a, with switch 210 closed and switch 211 open. The second conversion path 201b is thus connected to receive the second analogue input signal Ain2. In this mode, the first and second conversion paths are connected to receive and convert separate input signals Ain1 and Ain2 respectively. The first mode of operation may thus be seen as an independent, single-path conversion mode where the two conversion paths are operating independently.

In this mode, the second conversion path 201b is configured so that the gain of AFE 204b for input signal Ain2 is such that, for the maximum expected amplitude in normal operation, the output of AFE 204b is within the input range of the ADC 205b and preferably uses substantially all of the input range of the ADC 205a, i.e. the second conversion path is configured for processing a full scale of the second analogue input signal. In this mode, the second conversion path 201b could thus convert the full scale or range of input signal Ain2 without significant distortion due to clipping or overload or the like. In this first mode, the second conversion path may thus also be seen as operating as a standard performance conversion path able to cope with the full range of the input signal Ain2. The gain of the digital gain element 206 may be controlled to provide a desired overall conversion gain for the second conversion path in this mode.

In this first mode, the first and second conversion paths 201a and 201b thus are capable of converting separate input signals Ain1 and Ain2, received from different sources, e.g. microphones 203a and 203b, into separate output signals Dout1 and Dout2. In this first mode of operation the ADC circuit 200 may thus be capable of outputting the outputs from each of the conversion paths 201a and 201b as separate, independent, outputs.

In a second mode of operation, the second conversion path 201b is connected to the first input node 202a and disconnected from the second input node 202b, with switch 210 open and switch 211 closed. The second conversion path 201b is thus connected to receive the first analogue input signal Ain1. In this second mode the first and second conversion paths are thus both connected to receive the same input signal Ain1 and the conversion paths may be configured for processing different signal levels of input signal.

This second mode of operation may therefore be seen as a multi-path, in this case a dual-path, mode of operation for the first input signal Ain1.

In this mode, the AFE 204b of the second conversion path 201b is configured to provide a gain for input signal Ain1 which is greater than that of AFE 204a. The second conversion path may thus be configured so as to provide better performance for lower amplitude input signals, e.g. in terms of SNR, than the first conversion path. In this mode the AFE 204b may thus be configured with a relatively high gain, such that a low amplitude input signal is amplified to use a greater extent of the input range of the relevant ADC than would be the case for the first conversion path 201a. The gain of digital gain element 206 may be controlled so as to match the overall conversion gain of the second conversion path 201b to that of the first conversion path 201a. As discussed with respect to FIG. 1, the gain applied by the digital gain element 206 may, in effect, be an attenuation which has the effect of attenuating the noise of ADC 205b. It will be understood that FIG. 2 illustrates digital gain element 206 in the second conversion path 201a only, but in some implementations there could additionally or alternative be a digital gain element in the first conversion path 201a for providing gain matching of the two paths in the second mode of operation.

In this second mode of operation the output of the ADC is selected from the first conversion path 201a and/or the second signal path 201b, depending on the signal level of the input signal Ain1. The ADC circuit thus includes an output path selector 207, which receives the outputs of both conversion paths and provides a dual-path mode output DoutD, and a controller 208 for controlling the selector 207, in a similar manner as described with reference to FIG. 1. As discussed with reference to FIG. 1, the selector 207 could comprise a switched selector or multiplexor or the like for selecting the output of one conversion path or the other, but preferably the selector comprises a mixer or fader or the like operable for crossfading between the outputs of the two conversion paths. The controller 208 controls the selector based an indication of the signal level of the input signal, which in this example is the digital output of at least one of the conversion paths, but it will be understood that an indication of the input signal level could be provided in other ways.

This second mode of operation thus provides the benefits of dual-path operation for the input signal Ain1, with the two conversion paths being configured for processing input signals of different levels. The first conversion path 201a is configured to process higher amplitude input signals, to allow the ADC circuit to operate with the required dynamic range, with the second conversion path 201b being configured to convert lower amplitude signals with a better SNR.

The mode of operation of the ADC circuit 200 may be controlled by controller 208, which may generate a path select control signal PS for selecting the relevant input for the second conversion path 201b, i.e. for controlling switches 210 and 211. The controller 208 may also generate a gain control signal GA2 for controlling the analogue gain of the AFE 204*b* and/or a gain control signal GD2 for controlling the digital gain of the digital gain element 206 of the second conversion path. In some embodiments the controller may control the mode of operation responsive to a receive mode select signal MS, which may be received from some other circuitry, which may be off-chip. It will be noted that whilst FIG. 2 illustrates controller 208 as being operable to control both the mode of operation of the ADC circuit 200 and also control the output path selection when operating in the second, dual-path, mode of operation, in some implementations these functions could be implemented by different control modules.

In the second, dual-path, mode of operation the second conversion path 201*b* may thus be configured for lower amplitude input signals and thus the gain of AFE 204*b* may be relatively high. When operating in this mode, if the input signal Ain1 has a relatively high amplitude, the relatively high gain of the AFE 204*b* can lead to signal clipping in the second conversion path, and hence at such signal levels, the selector 207 is controlled to output the first digital signal Dout1 from the first conversion path as the dual-path output DoutD. In some implementations, however, clipping of the second conversion path 201*b* may have an undesirable impact on the first conversion path. If the signal level of the input signal Ain1 leads to clipping in the second conversion path 201*b*, then for AFE 204*b* the virtual earth may cease to be correctly regulated by the amplifier of the AFE 204*b*. This can result in a non-linear current being drawn from the input node 201*a*, which can result in distortion in the first conversion path as the AFE 204*a* supplies the correction current.

In some embodiments therefore the ADC circuitry 200 may be configured so as to limit or prevent such a non-linear current when operating in the second mode. In some implementations the controller 208 may be configured to control the gain GA2 of the AFE 204*b* so as to reduce the gain based on the indication of signal amplitude of the input signal Ain1 to limit or prevent clipping of the second conversion path. At such signal amplitudes the controller 208 will control the selector 207 to select the digital signal output from the first conversion path 201*a*, and thus the variation in gain in the second signal path will not negatively impact the digital output, but can help to reduce or eliminate distortion in the first conversion path 201*a*. Additionally or alternatively the controller 208 could generate a clipping control signal CC to reconfigure at least part of the second conversion path 201*b* to reduce or prevent the occurrence of a non-linear current being drawn from the first input node due to clipping of the second conversion path 201*b*. For example, the virtual earth(s) of the AFE 204*b* could be switched to be coupled to a buffered reference when needed so as to maintain regulation or, for a differential signal path, the differential virtual earth nodes could be connected together to prevent the amplifier from seeing the differential input swing.

The ADC circuit 200 allows for increased flexibility compared to the conventional dual-path ADC illustrated with respect to FIG. 1. In the ADC circuit 100 illustrated in FIG. 1, the two conversion paths are coupled to the same input to receive the same signal. In addition, the components of the two conversion paths are dedicated components for the appropriate signal level. That is, the second conversion path 102*b* of the ADC circuit 100 can only be used for low amplitude signals and will overload if used for higher amplitude input signals. In the ADC circuit 200, the second conversion path 201*b* can be configured to process low amplitude signals with good SNR or can be configured to process full scale input signals.

The ADC circuit 200 is advantageous in that it can allow the same circuit to be used for different applications. For an application where high performance is required for an analogue input, the circuit could be configured with the analogue source coupled to the first input node 202*a* and the ADC circuit could be operated in the second, dual-path mode. In this case it may be that no source is connected to the second input node. Alternatively, for an application where two separate conversion paths are required, and the standard performance from each conversion path is sufficient, the first and second input nodes could be connected to separate sources and the ADC circuit could be operated in the first, independent conversion mode. The ability to allow the same circuit to be used in different applications can be advantageous as a circuit manufacturer, who may supply components to a device manufacturer, may be able to supply the same part for different devices. In these example applications the mode of operation of the ADC circuit may be set at the time of device manufacture.

In at least some applications, however the mode of operation of the ADC circuit 200 may be controllably varied in use, for example based on an operating state of a host device. As noted above, for some applications, it may be that the high performance provided by the first, dual-path, mode of operation, may only be required for certain analogue inputs at certain times or in certain use cases which may mean, that for the conventional dual-path approach, the dual-path is only utilized for some of the time. In such use cases, when high performance is required for the analogue input signal from one of the sources, it may be that no processing of the analogue input from another of the sources is required and/or it may be acceptable for the processing of the input from such other acoustic source to be stopped.

For example, a host device may comprise at least two microphones and in one operating state it may be desirable for more than one microphone to be active at the same time. For instance, some electronic devices may be operable to be voice controlled by a user, i.e. to respond to at least some spoken commands, and it may be desirable for two microphones, which may be at different locations on the device, to be active so as to allow for monitoring for any spoken commands. Using more than one microphone may allow for better reliability in detecting relevant spoken commands. Especially if the device is operable with an always-on voice functionality, i.e. so that a user can speak a command at any time without needing to physically interact with the host device, power consumption is important and it is generally desirable for the monitoring to be relatively low power. Thus, it can be beneficial to provide conversion for each microphone input signal using a single conversion path to avoid the power consumption of the dual-path approach, at least until some signal activity of interest is detected. In some instances, if signal activity corresponding to speech is detected in the input signal(s) from one or both of the microphones, the device could switch to a higher performance mode if desired and provide dual-path processing for one of the microphone input signals, which may be the signal in which the speech was detected or which is deemed to be of better quality—and at that point duplicate processing of the other microphone input may no longer be needed. Additionally or alternatively such a device may also be operable in other states in which high quality conversion for just one of the microphones is desired. For instance, the device may be operable for audio/video recording, and if, when the recording function is operated it may be desirable to provide a high quality digital output from a specific microphone of the device.

Thus, in some applications, the ADC circuit may be implemented in a host device with both the first and second input nodes 202a and 202b coupled so as to be capable, in use, of receiving analogue inputs from separate analogue sources, e.g. microphones 203a and 203b. In one operating state of the host device, the ADC circuit 200 may be operated in the first, independent conversion, mode of operation, so that either or both analogue sources may be active as required and provide a respective analogue input signal Ain1 or Ain2 which is converted to a digital output Dout1 or Dout2 by the relevant conversion path 201a or 201b. The host device may, however, transition to a different operating state and the ADC circuit 200 may change to operating in the second, dual-path, mode of operation. In this case, switch 210 may be opened and switch 211 closed to disconnect the second conversion path from the second input node 202b and instead connect it to the first input node 202a. In some embodiments the gain of a programmable gain amplifier of the AFE 204b may be varied to a suitable value for the second mode of operation, which may be predefined, although in some embodiments at least some of the change in gain may be due to switching of the inputs and different components in the different input paths. In this operating state the output of the ADC circuit 200 will be the dual-path output DoutD, which thus provides high-performance for the first analogue input Ain1.

This operation can be advantageous as it allows for dual-mode operation when desired for the analogue input Ain1, which can provide an output DoutD with a better SNR for low amplitude input signals than would be the case when using the first conversion path alone. However, if such dual-mode operation is required only relatively infrequently, it avoids the need for a dedicated high-gain conversion path connected to the first input node, with the associated circuit area, that is used only infrequently. Instead, when not operating in the high-performance mode for the input signal Ain1, the second conversion path may be used for processing of signals from a different analogue source.

Figure 3:
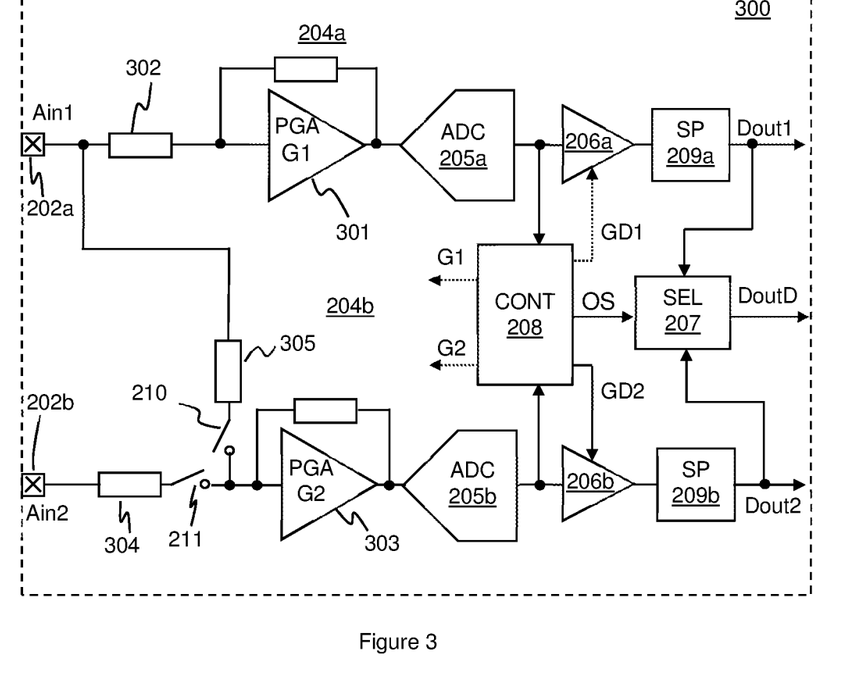
FIG. 3 illustrates an ADC circuit with one example of suitable AFEs.

The AFEs 204a and 204b may be configured to apply different gains, when connected to the different input nodes 202a and 202b, in any convenient way. FIG. 3 illustrates one example of ADC circuitry 300 which illustrates the AFEs 204a and 204b in more detail. FIG. 3 illustrates that the AFE 204a comprises a programmable gain amplifier (PGA) 301. The PGA 301 is coupled to first input node 202a via an input resistance 302. The gain G1 of the PGA 301 and input resistance 302 are configured together to provide an appropriate gain for the input signal Ain1 to convert full range signals.

AFE 204b comprises a PGA 303. When connected to the second input node, the PGA 303 is coupled to receive the input signal Ain2 via an input resistance 304. In this mode the gain G2 of PGA 303 is set to provide an appropriate gain for the input signal Ain2 to convert full range signals. When connected to the first input node, however, the PGA 303 is coupled to receive the input signal Ain1 via an input resistance 305, and the gain G2 of PGA 303 is set to provide an appropriate gain for low amplitudes of input signal Ain2.

FIG. 3 illustrates that, in this example, the first conversion path also comprises a digital gain element 206a, which may have a gain controlled by controlled by a gain control signal GD1 from controller 208, in addition to the digital gain element 206b in the second conversion path.

In some embodiments the gains G1 and G2 of both PGAs 301 and 303 may be configurable in use and may be varied, for instance by controller 208, when switching between the modes of operation so as to provide appropriate gains for the AFEs of the two conversion paths.

It should be noted that in the discussion above, the first conversion path 201a is used as the low-gain path for full scale signals in the second, dual-path, mode of operation, with the second conversion path being used as the high-gain path for lower amplitude signals. This arrangement may be advantageous as it avoids reconfiguration of the first conversion path when switching between modes. However, it would be possible, in some embodiments, to use the first conversion path as the high-gain path in the second, dual-path mode of operation, with the second conversion path providing the low-gain path for full scale signals. In this case the effective gain of the AFE 204a of the first conversion path 201a may be varied when switching between modes, for instance by connecting the first conversion path 201a to the first input node via different input resistances and/or varying the gain of the PGA 301.

It should also be noted that FIGS. 2 and 3 illustrate that the first conversion path 201a is coupled to the first input node 202a, whilst the second conversion path 201b may be selectively coupled to either of the first or second input nodes 202a or 202b. It would be possible however for the first conversion path to be selectively coupled to either of the input nodes 202a or 202b, which could allow independent conversion of separate inputs at both the input nodes 201a and 202b, or dual-path operation for an input from one of the input nodes, which could be selected to be the first input node 202a or the second input node 202b.

Figure 4:
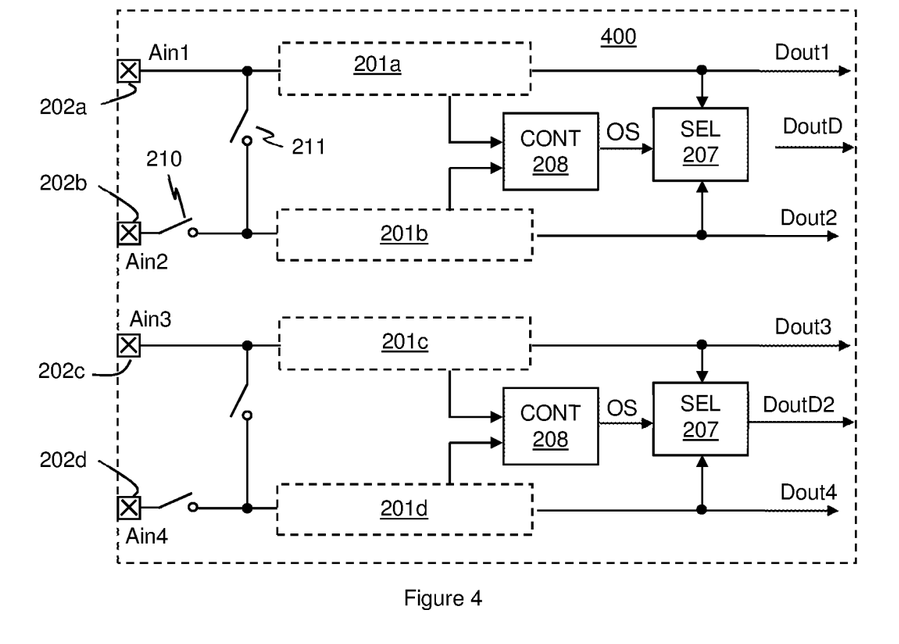
FIG. 4 illustrates another example of an ADC circuit.

FIGS. 2 and 3 illustrate examples of ADC circuitry with two conversion paths that can be used independently to convert separate signals from separate analogues sources, or which can be configured to provide dual path operation for an analogue input signal from a given analogue source. It will be understood however that the principles are applicable to ADC circuitry with more than two conversion paths. In some applications there may be multiple pairs of conversion paths, each operable to independently convert input analogue signals from a respective input, but also operable in a dual-path mode for one of the inputs for that pair. For example, FIG. 4 illustrates one example of ADC circuitry 400 with four separate input nodes 202a, 202b, 202c and 202d and four conversion paths 201a, 202b, 201c and 201d. The first and second conversion paths may be operable as described above with respect to FIGS. 2 and 3, i.e. operable in a first mode to independently convert signals from input nodes 202a and 202b respectively to provide output Dout1 and Dout2 or operable in a second, dual-path, mode of operation for an input signal Ain1 from input node 201a. The third and fourth conversion paths 201c and 201d may likewise be operable in a similar manner and operable in one mode to independently convert signals from input nodes 202c and 202d respectively to provide output Dout3 and Dout4, or in a dual-path mode of operation for input node 201c, providing an dual-path output DoutD2. It will be understood that the mode of operation of the first and second conversion paths may be controlled independently of the mode of operation of the third and fourth conversion paths.

The ADC circuit 400 thus offer a significant degree of flexibility in how the various conversion paths could be used. In one mode of operation, the ADC circuit 400 could be used to allow for independent conversion of four separate analogue signals Ain1, Ain2, Ain3, and Ain4 from four separate analogue sources to provide four separate digital outputs Dout1, Dout2, Dout3 and Dout4. In one mode of operation, the ADC circuit 400 could be used to allow for independent conversion of two separate analogue signals, say Ain1 and Ain 2 using conversion paths 201a and 201b, whilst providing dual-path operation for a third analogue input signal Ain3 from a third source, say using conversion paths 201c and 201d to provide digital outputs Dout1, Dout2 and and DoutD2.

Alternatively conversion paths 201c and 201d could provide independent conversion of input signals Ain3 and Ain4 to provide output Dout3 and Dout4, with conversion paths 201a and 201b used for dual-path operation for input signal Ain1 to provide output DoutD. In another mode of operation, the ADC circuit could allow for separate dual-path conversion of two different input signals Ain1 and Ain3, received at input nodes 202a and 202c respectively, to provide outputs DoutD and DoutD2.

It will be understood that other possibility of connections between the inputs and the conversion paths are possible however.

For example, in some applications it may be possible to connect more than two different conversion paths to the same input node to receive and process the same signal. Thus, in addition to the first and second conversion paths described with reference to FIG. 2, there may be at least a third conversion path that may, in use, be coupled to the first input node to receive and convert the input signal Ain1. The third conversion path could, when connected to the first input node, be configured for input signals in a different range to the first and second conversion paths, e.g. so one conversion path is optimised for full-range signals, one conversion path is configured for mid-range signals and the other conversion path is configured for low range signals to provide tri-path operation. Alternatively providing both the second and third conversion paths with the ability to connect to the first input node may allow the choice whether to use the second or third conversion path for dual-path operation for the first input. This may allow flexibility in deciding which input signal to stop processing when high-performance is required for the signal from the first input node.

Additionally or alternatively, in some implementations it may be possible to selectively connect a given conversion paths to more than two different input nodes. Thus, in addition to the first and second conversion paths described with reference to FIG. 2, there may be at least a third conversion path coupled to receive an input signal from a third input node. The second conversion path may be configured to be selectively coupled to any of the first, second or third input nodes. This could allow the second conversion path to be used as an independent path for receiving and converting an input signal Ain2 from the second input node, or to be connected in a dual-path mode of operation to either of the first or third input nodes, i.e. the second conversion path may be used in conjunction with either the first conversion path or the third conversion path to provide dual-path operation for the input signal Ain1 or the input signal Ain3 as required.

Figure 5:
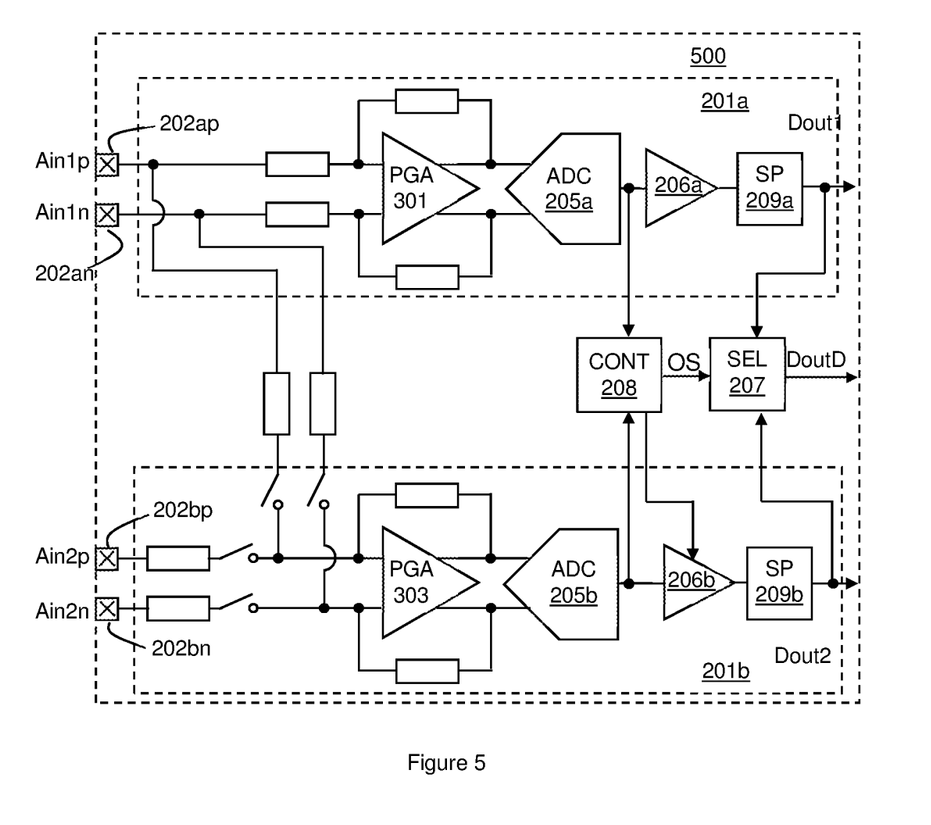
FIG. 5 illustrates an example of an ADC circuit according to an embodiment with differential conversion paths with differential inputs.

As noted above, in some instances the input signal could be received as a differential signal and/or the conversion paths could be differential paths. FIG. 5 illustrates an example of ADC circuitry 500 according to an embodiment with a differential input and differential conversion paths. FIG. 5 shows that the first input node comprises inputs 202ap and 202an for receiving components Ain1p and Ain1n of a differential signal from a first source and likewise the second input node comprises inputs 202bp and 202bn for receiving components Ain2p and Ain2n of a differential signal from a second, different, source. FIG. 5 also shows that the analogue part of the conversion paths 201a and 201b are differential.

The various embodiments described herein thus allow the first and second conversion paths to be used, in a dual-path mode of operation to process the same signal, with the first and second conversion path optimised for different signal levels. This mode of operation can provide good performance, but increases the power consumption associated with the conversion of that particular analogue input signal, as two conversion paths are actively processing that signal. In some instances, the high performance may generally be required when the input signal is at a low signal level for a relatively protracted period of time. If, however, the input signal remains at a low level for a relatively protracted period of time, the digital output for that input signal will be derived only from the conversion path optimised for low level signals, which may be the second conversion path in some of the examples above. In some embodiments therefore the ADC circuit may be configured, when operating in the second, dual-path mode of operation, to be operable, in response to a low-signal condition, to suspend or disable at least some components of the conversion path for full scale signals, e.g. the first conversion path, to save power. The low signal condition could be detected by the controller 208 and could, for example, comprise the controller detecting that the digital output of the conversion path optimised for low level signals remains below a defined threshold for a determined period of time, or meeting some other defined criteria. Additionally or alternatively the controller may receive an indication of signal level from some other monitoring circuitry, which may directly monitor the analogue input, or some other controller could determine the low signal condition and generate a control signal for controller 208.

In some implementations the ADC circuit may be operable, in at least the second, multi-path mode of operation, to provide an indication of the present noise or an indication of dynamic range for the output(s) of the ADC circuit. Referring back to FIG. 2, the controller 208 may thus output a signal N/DR that is indicative of a noise parameter of the circuit, e.g. the present SNR, and/or indicative of dynamic range. In the second, dual-path, mode of operation the controller 208 controls the selector to output the output signal DoutD based on the output of the first conversion path 201a or the second conversion path 201b or as a combination from both paths. When the output signal DoutD is entirely selected from just one of the conversion paths, i.e. 100% of the output signal DoutD is derived from the first conversion path 201a or the second conversion path 201b, the noise floor is due to the relevant path as configured in the dual-path mode. An indication of the noise floor or dynamic range for each of the relevant paths in this mode may be known and stored. Thus, based on which conversion path is selected to provide the output signal DoutD, the noise floor for that path can be determined and identified as the present noise floor for the conversion. When the output signal DoutD is provided by selector 207 as a combination of signals from both conversion paths, e.g. during cross fading, the overall noise floor will depend on the relevant contributions from each path, which will depend on the settings of the mixer or cross-fader of the selector 207, for instance the coefficients of a filter of selector 207. The relationship between the relevant setting of the selector 207 and the resulting noise floor can be determined, e.g. by calculation, modelling and/or testing, and stored in a look-up table or similar. Thus based on the present settings of the selector 207, an indication of the present noise floor or dynamic range may be determined and could be output as the signal N/DR. Such a signal may of use for some downstream processing of the digital output, for instance by outputting the present, instantaneous noise floor, it can be determined whether there is any significant signal content. As the controller also receives an indication of the signal amplitude, the controller could additionally or alternatively output an indication of the present SNR. Embodiments of the present disclosure thus provide ADC circuitry for converting input analogue signals to digital. The ADC circuits according to embodiments offer flexibility in processing of analogue input signals, and can be configured to provide multi-path processing for a given analogue input. If multi-path processing is not required, the relevant conversion path can be used independently for converting other signals, which can reduce circuit area.

Embodiments are particularly applicable to audio processing circuitry, e.g. for processing input analogue signals from one or more microphones. Note that as used herein the term audio shall be taken to include signals representing audible sounds that could be heard by a listener, but shall also include signals at other frequencies, e.g. at ultrasonic frequencies for other applications, such as machine to machine communication or proximity or gesture sensing or the like. The principles may also be applied to signals from other transducers than microphones, such as various sensor transducers.

Embodiments may be arranged as part of an audio and/or signal processing circuit, for instance an audio circuit such as a codec which may be provided in a host device. A circuit according to an embodiment of the present invention may be implemented as an integrated circuit.

Embodiments may be incorporated in a host electronic device, which may for example be a portable device and/or a device operable with battery power. The host device could a device with one or more microphones provided as part of the host device and/or a connector for making a wired connection with a microphone of a removable accessory apparatus that may be removably connected to the host device in use. The host device may include a wireless communication module for receiving input data. The host device could be a communication device such as a mobile telephone or smartphone or similar, a computing device such as notebook, laptop or tablet computing device, a wearable device such as a smartwatch. The host device could alternatively be an accessory device for use with any such communication, computing or wearable device. The host device could be a device with voice control or activation functionality.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Analogue to digital conversion circuitry comprising:
    a first input node for receiving a first analogue input signal;
    a second input node for receiving a second analogue input signal;
    a first conversion path for converting analogue signals to digital;
    a second conversion path for converting analogue signals to digital;
    wherein the analogue to digital conversion circuitry is selectively operable in:
        a first mode in which the first conversion path is connected to the first input node to convert the first analogue input signal to a first digital signal and the second conversion path is connected to the second input node to convert the second analogue input signal to a second digital signal, wherein in the first mode each of the first and second conversion paths are configured for processing a full scale of the respective first and second analogue input signals and the first and second digital signals are output as first and second output signals respectively; and
        a second mode in which the first conversion path and the second conversion path are both connected to the first input node to convert the first analogue input signal to respective first and second digital signals, wherein in the second mode, the first and second conversion paths are configured for processing different signal levels of the first analogue input signal and a selector is configured to select the first digital signal or the second digital to be output as an output signal based on an indication of amplitude of the first analogue input signal.

2. Analogue to digital conversion circuitry as claimed in claim 1 wherein, in the second mode, the first conversion path is configured for processing a full scale of the first analogue input signal and the second conversion path is configured for processing lower amplitude signal levels of the first analogue input signal.

3. Analogue to digital conversion circuitry as claimed in claim 1 wherein the first and second conversion paths each comprise respective analogue-front-ends and wherein, in the second mode of operation, the respective analogue-front-end of the second conversion path is configured to apply a larger gain to the first analogue input signal that the analogue-front-end of the first conversion path.

4. Analogue to digital conversion circuitry as claimed in claim 3 wherein the analogue-front-end of the second conversion path comprises a programmable gain amplifier.

5. Analogue to digital conversion circuitry as claimed in claim 4 comprising a mode controller for controlling the gain of the programmable gain amplifier of the analogue-front-end of the second conversion path to be different in the first and second modes.

6. Analogue to digital conversion circuitry as claimed in claim 3 wherein the analogue-front-end of the first conversion path comprises a programmable gain amplifier.

7. Analogue to digital conversion circuitry as claimed in claim 1 wherein at least one of the first and second conversion paths comprises a digital gain element for applying a gain to the relevant first digital signal or second digital signal in the second mode to provide gain matching of the first and second conversion paths.

8. Analogue to digital conversion circuitry as claimed in claim 1 wherein the analogue to digital circuitry is operable to dynamically switch between the first and second modes in use.

9. Analogue to digital conversion circuitry as claimed in claim 1 comprising at least one switch for selectively connecting the second conversion path to the first input node or the second input node.

10. Analogue to digital conversion circuitry as claimed in claim 9 wherein the second conversion path is configured to be switchably connected to the first input node via a first input resistor and switchably connected to the second input node via a second, different input resistor.

11. Analogue to digital conversion circuitry as claimed in claim 1 wherein the selector comprises a fader configured to transition between outputting one of the first and second digital signals as the selector output signal to outputting the other of the first and second digital signals by cross-fading between the first and second digital signals.

12. Analogue to digital conversion circuitry as claimed in claim 1 further comprising a controller configured to, when operating in the second mode, suspend or disable at least some components of the first conversion path in response to a low-signal condition.

13. Analogue to digital conversion circuitry as claimed in claim 12 wherein the low-signal condition comprises the amplitude of the second digital signal remaining below a defined threshold for a defined period of time.

14. Analogue to digital conversion circuitry as claimed in claim 1 further comprising at least one additional conversion path operable, in one mode, to be connected to an associated additional input node to convert an additional analogue input signal received at that additional input node to a digital signal.

15. Analogue to digital conversion circuitry as claimed in claim 14 wherein said at least one additional conversion path is further operable, in another mode, to be connected to one of the first input node, the second input node or a further additional input node to convert the analogue input signal received at the relevant input node to a digital signal.

16. Analogue to digital conversion circuitry as claimed in claim 1 further comprising a clipping controller configured to, when operating in the second mode, to control the second conversion path to reduce or prevent a non-linear current being drawn from the first input node due to clipping of the second conversion path.

17. Analogue to digital conversion circuitry as claimed in claim 16 wherein the clipping controller is configured to control a gain of the second conversion path to prevent clipping of the second conversion path.

18. Analogue to digital conversion circuitry as claimed in claim 16 wherein the clipping controller is configured to reconfigure the second conversion path to provide regulation of a virtual earth node of the second conversion path.

19. Analogue to digital conversion circuitry as claimed in claim 1 wherein the analogue to digital conversion circuitry is configured to output an indication of instantaneous noise and/or dynamic range.

20. Analogue to digital conversion circuitry as claimed in claim 19 comprising a module for determining the indication of instantaneous noise and/or dynamic range based on a setting of the selector that determines contribution to the output signal from the first digital signal and the second digital signal.

21. Analogue to digital conversion circuitry as claimed in claim 1 in any preceding claim implemented as an integrated circuit.

22. Analogue to digital conversion circuitry as claimed in claim 21 further comprising a first microphone coupled to the first input node of the integrated circuit and a second microphone coupled to the second input node of the integrated circuit.

23. An electronic device comprising analogue to digital conversion circuitry as claimed in claim 1.

* * * * *

UNITED STATES PATENT AND TRADEMARK OFFICE
CERTIFICATE OF CORRECTION

PATENT NO. : 11,528,031 B2
APPLICATION NO. : 17/184295
DATED : December 13, 2022
INVENTOR(S) : Howlett et al.

It is certified that error appears in the above-identified patent and that said Letters Patent is hereby corrected as shown below:

In the Specification

In Column 1, Line 18, delete "to" and insert -- them to --, therefor.

In Column 2, Line 44, delete "example" and insert -- examples --, therefor.

In Column 3, Line 31, delete "is operable is operable" and insert -- is operable --, therefor.

In Column 4, Line 31, delete "signals" and insert -- signal --, therefor.

In Column 4, Line 58, delete "first conversion path 101b." and insert -- first conversion path 101a. --, therefor.

In Column 4, Lines 64-65, delete "second conversion path 101a" and insert -- second conversion path 101b --, therefor.

In Column 5, Line 1, delete "alternative" and insert -- alternatively --, therefor.

In Column 7, Line 27, delete "be" and insert -- by --, therefor.

In Column 8, Lines 31-32, delete "alternative" and insert -- alternatively --, therefor.

In Column 8, Line 49, delete "an" and insert -- on an --, therefor.

In Column 11, Line 61, delete "controlled by controlled by" and insert -- controlled by --, therefor.

In Column 12, Line 26, delete "201a" and insert -- 202a --, therefor.

In Column 12, Line 43, delete "202b" and insert -- 201b --, therefor.

Signed and Sealed this
Ninth Day of May, 2023

Katherine Kelly Vidal
*Director of the United States Patent and Trademark Office*

CERTIFICATE OF CORRECTION (continued)
U.S. Pat. No. 11,528,031 B2

In Column 12, Line 55, delete "an" and insert -- a --, therefor.

In Column 13, Line 1, delete "Ain 2" and insert -- Ain2 --, therefor.

In Column 14, Line 66, delete "of" and insert -- be of --, therefor.

In Column 15, Line 33, delete "a" and insert -- be a --, therefor.

In the Claims

In Column 17, Line 58, in Claim 3, delete "that" and insert -- than --, therefor.

In Column 18, Line 11, in Claim 8, delete "analogue to digital circuitry" and insert -- analogue to digital conversion circuitry --, therefor.

In Column 18, Line 54, in Claim 16, delete "being" and insert -- from being --, therefor.